United States Patent
Li (10) Patent No.: US 9,058,999 B2
(45) Date of Patent: Jun. 16, 2015

(54) LOW VOLTAGE METAL GATE ANTIFUSE WITH DEPLETION MODE MOSFET

(71) Applicant: International Business Machines Corporation, Armonk, NY (US)

(72) Inventor: Yan-Zun Li, Lagrangeville, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/449,180

(22) Filed: Aug. 1, 2014

(65) Prior Publication Data
US 2014/0340138 A1    Nov. 20, 2014

Related U.S. Application Data

(62) Division of application No. 13/169,485, filed on Jun. 27, 2011, now Pat. No. 8,891,328.

(51) Int. Cl.
*G11C 7/00* (2006.01)
*H01L 27/02* (2006.01)
(Continued)

(52) U.S. Cl.
CPC ............ *H01L 27/0288* (2013.01); *G11C 17/16* (2013.01); *G11C 17/18* (2013.01); *H01L 23/5252* (2013.01)

(58) Field of Classification Search
CPC ........... G11C 16/3427; G11C 13/0011; G11C 13/0007; G11C 2213/31; G11C 16/0466; G11C 17/16; G11C 17/18; G11C 5/02; G11C 7/00
USPC .............. 365/225.7, 148, 156, 158, 161, 163, 365/171–173
See application file for complete search history.

(56) References Cited

U.S. PATENT DOCUMENTS

| | | |
|---|---|---|
| 5,774,011 A | 6/1998 | Au et al. |
| 5,920,110 A | 7/1999 | Crafts et al. |

(Continued)

FOREIGN PATENT DOCUMENTS

| | | |
|---|---|---|
| JP | 2001308283 A | 11/2001 |
| KR | 1020060087660 A | 8/2006 |

OTHER PUBLICATIONS

Pending U.S. Appl. No. 13/169,485, entitled "Low Voltage Metal Gate Antifuse With Depletion Mode MOSFET", filed Jun. 27, 2011.

(Continued)

*Primary Examiner* — Hien Nguyen
(74) *Attorney, Agent, or Firm* — Yuanmin Cai; Steven M. Kellner (57) ABSTRACT

An antifuse according to an embodiment of the invention herein can include a depletion mode metal oxide semiconductor field effect transistor ("MOSFET") having a conduction channel and a metal gate overlying the conduction channel. A cathode and an anode of the antifuse can be electrically coupled to the gate, such that the antifuse is programmable by driving a programming current between the cathode and the anode to cause material of the metal gate to migrate away. Under appropriate biasing conditions, when the antifuse is unprogrammed, the conduction channel is turned on unless a voltage above a first threshold voltage is applied to the gate to turn off the conduction channel. The gate can be configured such that when the antifuse has been programmed, the conduction channel remains turned on even if a voltage above the first threshold voltage is applied between the gate and a source region of the MOSFET.

20 Claims, 5 Drawing Sheets

(51) Int. Cl.
*G11C 17/16* (2006.01)
*G11C 17/18* (2006.01)
*H01L 23/525* (2006.01)

(56) References Cited

U.S. PATENT DOCUMENTS

| | | |
|---|---|---|
| 6,436,749 B1 | 8/2002 | Tonti et al. |
| 6,515,931 B2 | 2/2003 | Marr et al. |
| 8,208,279 B2 | 6/2012 | Lue |
| 8,503,213 B2 | 8/2013 | Chen et al. |
| 2008/0006902 A1 | 1/2008 | Chakravarti et al. |
| 2008/0197911 A1 | 8/2008 | Lim et al. |
| 2008/0265936 A1 | 10/2008 | Vora |
| 2009/0052221 A1 | 2/2009 | Ogawa |
| 2010/0149898 A1 | 6/2010 | Tak et al. |
| 2010/0226195 A1 | 9/2010 | Lue |
| 2010/0252880 A1 | 10/2010 | Stribley |
| 2010/0295132 A1 | 11/2010 | Wang et al. |

OTHER PUBLICATIONS

Non-Final Office Action for U.S. Appl. No. 13/169,485, mailed on Apr. 3, 2014.
Notice of Allowance for U.S. Appl. No. 13/169,485, mailed on Jul. 14, 2014.

LOW VOLTAGE METAL GATE ANTIFUSE WITH DEPLETION MODE MOSFET

BACKGROUND

The subject matter of the present application relates to electrical antifuses, especially such devices provided in integrated circuit chips.

Integrated circuit chips often include elements which can be permanently altered after manufacture in order to make changes to circuits therein, or to maintain states or data on the chip. For example, an integrated circuit chip can include electrically operable fuses or an array of fuses to store critical information on chip, to conduct redundancy repair to improve manufacturing yield, or to fine tune circuit performance through local circuit trimming, among other purposes. Such fuses initially begin as conductive elements, i.e., devices which are closed circuit in that initially, they are electrically connected between external terminals. A fuse can be programmed, i.e., blown, to make it much less conductive, i.e., open circuited in that it effectively is no longer electrically connected between external terminals. Electrical antifuses are alternative structures which can be provided on an integrated circuit. Electrical antifuses typically begin as elements which are essentially nonconductive, having high electrical resistance (i.e., open circuit state). Programming an antifuse greatly reduces the electrical resistance of the antifuse to a level at which the antifuse typically is electrically connected between external terminals, achieving in effect a closed circuit state.

One challenge faced by electrical fuses and antifuses used in integrated circuit chips is the ability to reliably program the fuse or antifuse. During programming, an electrical fuse may require a metal fuse link to melt under high current, which can cause local explosion with metal particles scattered far away from the blown fuse or stress cracks to form in adjacent dielectric materials and affect nearby circuits. In some electrical antifuses, a high voltage is applied across a thin dielectric layer to create a localized breakdown that is electrically conductive. These types of fuses and antifuses can sometimes fail to change completely to a programmed state, such that a fuse can remain too conductive even after programming, or an antifuse may not be sufficiently conductive after programming. In some cases, only 90-99% of these devices work properly when programmed. Another challenge for many of the fuse or antifuse solutions today which utilize such destructive mechanisms is the ability to maintain the programmed state of the fuse or antifuse throughout the useful life time of the chip in which it is incorporated. In aggravated application environments such as high temperature, some programmed fuses and antifuses may gradually change back into their previous unprogrammed states.

Moreover, fuses and antifuses may require special high voltage levels available on the integrated circuit chip for programming them. This can pose design challenges for supplying the voltage levels on the chip and contributes to the overall cost of making the chip.

SUMMARY

According to an aspect of the invention, an antifuse can include a depletion mode metal oxide semiconductor field effect transistor ("MOSFET") having a conduction channel and a metal gate overlying the conduction channel. A cathode and an anode of the antifuse can be electrically coupled to the gate and spaced apart from one another in a direction the gate extends, such that the antifuse is programmable by driving a programming current between the cathode and the anode to cause material of the metal gate to migrate away.

In one embodiment, the gate is configured such that, under appropriate biasing conditions, when the antifuse is unprogrammed, the conduction channel is turned on unless a voltage above a first threshold voltage is applied to the gate to turn off the conduction channel. The gate is configured such that when the antifuse has been programmed, the conduction channel remains turned on even if a voltage above the first threshold voltage is applied between the gate and a source region of the MOSFET.

In one embodiment, the gate may be configured such that the driving of the programming current generates a gap in the gate such that the conduction channel no longer can be turned off when the voltage greater than the threshold voltage is applied between the gate and the source region.

In an example of the antifuse, the source region and a drain region of the MOSFET can be separated from one another by the conduction channel, wherein a resistance between the source region and the drain region has a first value when the antifuse is unprogrammed and the voltage greater than the threshold voltage is applied to the gate, and the resistance between the source region and the drain region has a second value when the antifuse has been programmed and the voltage greater than the threshold voltage is applied to the gate. The second value can be one or more orders of magnitude lower than the first value.

In one example, an integrated circuit can include an antifuse according to one or more of the embodiments herein. The integrated circuit can have a detection circuit coupled to the antifuse, and the detection circuit can be configured to detect whether the antifuse has been programmed based on the value of the resistance between the source region and the drain region when the voltage greater than the threshold voltage is applied to the gate.

The gate can be configured to conduct the programming current when a programming voltage of less than one volt is applied between the cathode and the anode. In one example, such programming voltage can be the same as a power supply voltage that can be used to operate field effect transistors on a semiconductor chip which embodies the antifuse.

In one example, the cathode and the anode can be spaced apart from one another in a direction of a width of the conduction channel.

In one example, the depletion mode MOSFET can be a p-type channel depletion mode MOSFET. In such p-type MOSFET, the conduction channel when unprogrammed may remain turned on unless the gate is coupled to a voltage greater than ground.

Alternatively, the depletion mode MOSFET can be an n-type channel depletion mode MOSFET. In such n-type MOSFET, under appropriate biasing conditions the conduction channel of the antifuse when unprogrammed may remain turned on unless the gate is coupled to a voltage that is lower than ground.

In on example, the gate may include a metal layer adjacent a gate dielectric of the antifuse, and the antifuse can be programmable by the current between the cathode and the anode causing material of the metal layer to migrate away from the area therebetween.

A method of programming an antifuse is provided in accordance with another embodiment of the invention. Such method can include driving a programming current between a cathode and an anode of the antifuse, so as to drive the programming current through a gate of a depletion mode metal oxide semiconductor field effect transistor ("MOSFET"), in which the gate has at least one metal layer, and in which the cathode and the anode are each electrically coupled to the gate and spaced apart from one another in a direction the gate extends, so as to create a gap in the metal layer.

A method may further include detecting whether the antifuse has been programmed by applying a voltage greater than a threshold voltage between the gate and a source region of the MOSFET and detecting whether the conduction channel turns off with such applied voltage.

In one example, the driving of the programming current can generate a gap in the gate such that the conduction channel no longer turns off when the voltage greater than the threshold voltage is applied to the gate.

In an example, the MOSFET can include a source region and a drain region separated from the source region by a conduction channel, and a method may further include detecting an electrical resistance between the source region and the drain region when a voltage greater than a threshold voltage for turning off the conduction channel is applied to the gate, and using the detected resistance to determine whether or not the antifuse has been programmed.

In an example, the step of driving the programming current can be performed by applying a programming voltage which is the same as a power supply voltage used to operate field effect transistors on a semiconductor chip which embodies the antifuse.

In an example, the MOSFET can be a p-type channel depletion mode MOSFET, and the method may further include detecting whether the antifuse has been programmed while applying a voltage that is greater than ground to the gate.

In an example, the MOSFET can be an n-type channel depletion mode MOSFET, and the method may further include detecting whether the antifuse has been programmed while applying a voltage that is lower than ground to the gate.

DETAILED DESCRIPTION

Figure 1:
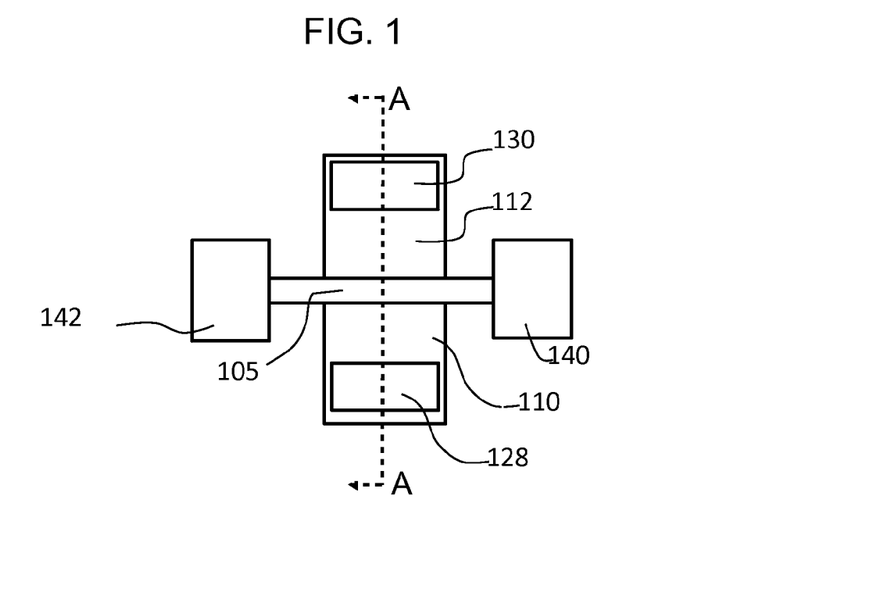
FIG. 1 is a top plan view of an antifuse according to an embodiment of the invention, showing the antifuse in an as yet unprogrammed state.
Figure 2:
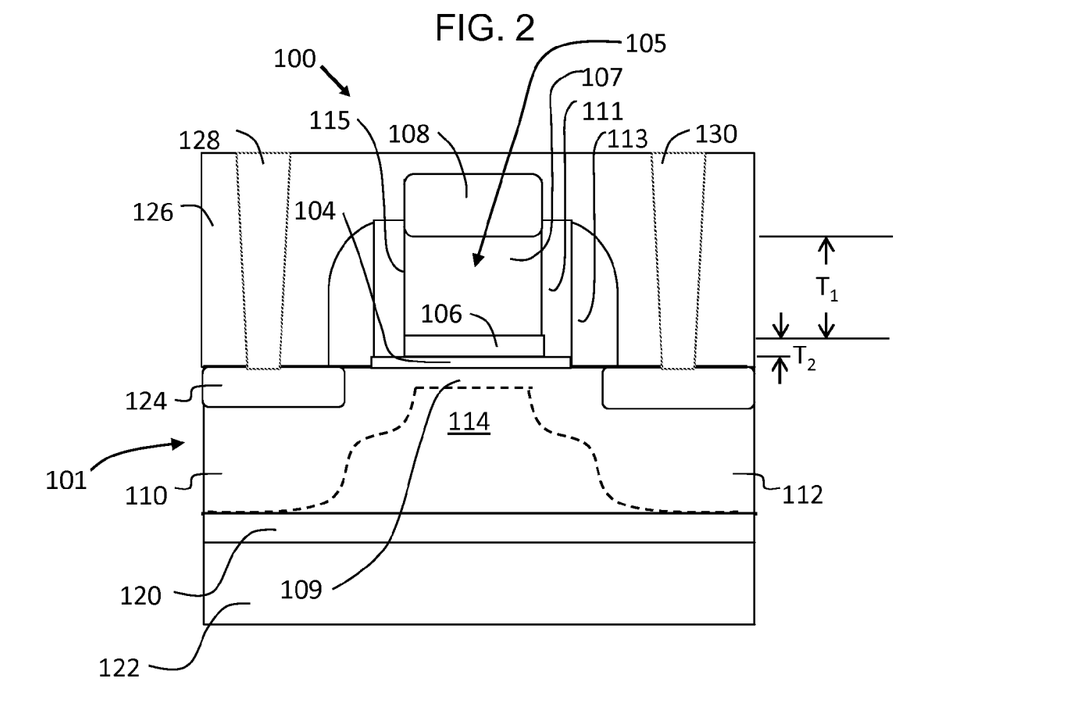
FIG. 2 is a corresponding sectional view of the antifuse of FIG. 1 through line A-A thereof.

Referring to FIGS. 1-2, in an embodiment of the invention, an insulated gate field effect transistor (MOSFET) designed to operate as depletion mode transistor, and having a metal gate 105, such as formed of metal layers 106, 107, and a cathode 140 and an anode 142 connected thereto serves as an antifuse 100. A depletion mode transistor is normally "on" such that a voltage greater than a particular magnitude is required to turn the transistor off. The metal gate of the antifuse serves as a fusible link which in the initial unprogrammed state is continuous and has low electrical resistance, and thus, with an appropriate bias voltage applied to the gate can turn off the flow of current between a source region 110 and a drain region 112 of the antifuse. In the programmed state, the metal gate may no longer be continuous, such that the gate may no longer be capable of turning off the flow of current between the source and drain regions. In one example, after the antifuse has been programmed the gate may still be able to reduce the flow of current between the source and drain regions but may not be able to turn off the current to the same extent as when the antifuse had not yet been programmed. Because the initial state of the antifuse is a transistor which can only be turned off with sufficient voltage on the entire gate over the channel region, a void created in the gate by programming the antifuse can hinder and eliminate the ability to turn off the antifuse after programming.

FIGS. 1 and 2 are a plan view and a corresponding sectional view along section line A-A, respectively, of an antifuse 100 in accordance with an embodiment of the invention. As seen therein, antifuse 100 in the unprogrammed state can have a structure similar to that of a depletion mode metal oxide semiconductor field effect transistor ("MOSFET"), such as may be embodied in a semiconductor chip having an integrated circuit therein. More concerning the function and operation of the depletion mode MOSFET will be described below.

The MOSFET has a gate 105 and a gate dielectric 104 separating and electrically insulating the gate 105 from an active semiconductor region 101. The gate 105 separates the cathode 140 and the anode 142 of the antifuse from one another, the cathode and anode being spaced apart in a direction the gate extends. The gate 105 typically is formed simultaneously with corresponding metal regions of transistors or other active semiconductor devices of the same semiconductor chip. The MOSFET can be referred to generally as a metal oxide semiconductor field effect transistor, whether or not the gate dielectric is an oxide as opposed to other gate dielectric materials which incorporate a nitride or other dielectric material. In one example, the gate dielectric layer 104 of the MOSFET may be a material having a relative high dielectric constant (e.g., hafnium oxides, hafnium silicates or other "high-K" dielectric materials such as ferroelectric dielectric materials, among others).

The gate 105 includes a region 106 of metal or a conductive compound of a metal adjacent to the gate dielectric 104. Such metal region 106 can serve as one or more of a barrier layer, adhesion layer, or a workfunction metal layer. The metal region 106 typically includes a metal such as titanium, tantalum, tungsten, lanthanum, an alloy of titanium, tungsten, or lanthanum, e.g., TiAl, or an electrically conductive compound of titanium or tungsten such as titanium nitride, tantalum nitride, tungsten nitride, and may include one or more layers of metal which can have the same or different compositions. Such metal region 106 typically has a thickness less than 100 angstroms in a direction of the thickness of the gate dielectric, but may be significantly thicker or thinner depending upon the application.

In one example, the metal region 106 can include multiple different layers selected from the aforementioned metals and conductive metal compounds, and may function as one or more of an adhesion metal layer, a barrier metal layer, and a workfunction metal layer of the antifuse. The antifuse typically has a primary gate region 107 of a metal such as aluminum, cobalt or copper, among other possible metals, the primary gate region 107 typically having lower electrical resistivity than the metal region 106. The primary gate region 107 typically has a greater thickness T1 in a direction of the thickness of the gate dielectric than the thickness T2 of metal region 106. In a particular example, the MOSFET may also include other relatively conductive material such as a region of silicide 108 overlying the primary gate region 107. In a particular embodiment (not shown), the MOSFET may include a further electrically conductive region of doped semiconductor material 107 between the primary gate region 107 and the silicide region 108. In one example, the gate 105 can be formed as a replacement metal gate within an opening defined by edges of spacers 111 adjacent to the gate.

As further seen in FIG. 2, the active semiconductor region 101 includes a body 114 separating a source region 110 of the antifuse from a drain region 112 thereof. Reference 109 points to the conduction channel of the depletion mode transistor that exists when the voltage on the gate is at zero or allowed to float, i.e., there is no applied gate voltage. The conduction channel has the same dopant type as source and drain regions and an appropriate concentration to permit current to flow between source and drain when the voltage on the gate is at zero or there is no applied gate voltage. Referring to FIGS. 1 and 2, the width of the conduction channel has about the same dimension as a portion of the length of the gate that overlies the conduction channel and extends in a direction between the cathode and the anode. The cathode and the anode are spaced apart from one another in a direction of a width of the conduction channel.

In one example, the active semiconductor region 101 of the antifuse may consist essentially of silicon. In other examples, the active semiconductor region may include or consist essentially of an alloy of silicon with another semiconductor, a III-V compound semiconductor material, e.g., gallium arsenide, or indium phosphide, among others, or alloy thereof, a II-VI compound semiconductor material or alloy thereof. In a particular example, the active semiconductor region may include a stressed semiconductor region of an alloy of silicon with another semiconductor material, such as a region of a silicon germanium or silicon carbon, for example, which may span the area of the active semiconductor region of the antifuse, or which may be limited to the source and drain regions 110, 112, or portions of the source and drain regions.

In the embodiment depicted in FIGS. 1-2, the active semiconductor region 101 can be provided in a silicon-on-insulator ("SOI") substrate which further includes a buried dielectric or buried oxide ("BOX") layer 120 which separates the active semiconductor region 101 from a bulk semiconductor region 122 of the substrate. In such example, the "silicon-on-insulator layer" is not limited to being only a silicon layer; rather, the active semiconductor region 101 may still include any of the aforementioned semiconductor materials.

Each of the source region 110 and the drain region 112 of the antifuse has a first conductivity type being one of p-type or n-type and the body 114 has a second conductivity type which is opposite the first conductivity type. Thus, the antifuse 100 can resemble a PFET when the source region 110 and drain 112 have p-type conductivity, and the body 114 includes an "n-well", i.e., a continuous portion of the active semiconductor region having n-type conductivity. In such example, the first and second semiconductor regions can be heavily doped, e.g., having a dopant concentration greater than about $10^{18}$ cm$^{-3}$, such that their dopant concentrations can be referred to as "p+". The dopant concentration of the body 114 in such case, being n-type conductivity, i.e., being an "n-well", is less heavily doped than the p+ doped region. In one example, the dopant concentration of the n-type body 114 can be in a range of $10^{14}$ cm$^{-3}$ to $10^{19}$ cm$^{-3}$ but must be less heavily doped than the adjacent p+ regions in any case. One or more threshold voltage adjustment implants is made to a shallow region of the n-well 114 adjacent the gate dielectric layer 104 to create the normally on conduction channel 109 of the antifuse. In one example, the one or more implants can be performed with the same conditions and at the same time as threshold voltage adjustment implants performed for NFET transistors being processed simultaneously on the same chip and same wafer. In another example, the one or more implants can be performed specific to the antifuse 100 under conditions which are also specific thereto, rather than being performed simultaneously with one or more implants used to create transistors on the same chip and wafer.

As further seen in FIG. 2, one or more pairs of dielectric spacers 111, 113 may overlie walls 115 of the gate 105. The antifuse may further include silicide regions 124 in contact with the source region 110 and drain region 112, and may in some cases include a silicide region 108, which may be in contact with a semiconductor region of the gate 107 when present. A dielectric region 126 overlies the silicide regions 124 and may also overlie the gate 105. The dielectric region 126 may or may not include a dielectric stressor layer, such as one made of silicon nitride, for example. As further shown in FIG. 1, conductive vias 128, 130 can extend through the dielectric region 126 to contact the silicide regions 124 that overlie the source and drain regions, respectively. In one example, the conductive vias 128, 130 may have a composite structure which includes two or more layers of conductive material such as a barrier layer adjacent the silicide regions 124 and a second conductive material layer such as a metal overlying the barrier layer.

As seen in FIG. 1, the cathode 140 and anode 142 are connected to the gate 105 at opposite ends thereof. The cathode and anode are made of electrically conductive material such as a metal or a conductive compound of a metal. The cathode and anode typically may directly contact the primary metal region 107 of the gate, or may alternatively contact a silicide layer of the gate or other layer of the gate which includes of conductive metal compound.

Turning now to its operation, the antifuse is a depletion mode MOSFET which, when as yet unprogrammed, has a normally "on" conduction channel 109 when a voltage is applied between the source and drain regions and a voltage Vgs of ground or no voltage is applied between the gate and the source. The conduction channel 109 may remain on as well for a voltage Vgs whose magnitude is less than a magnitude of a voltage $V_T$ required to turn off the antifuse.

Figure 3:
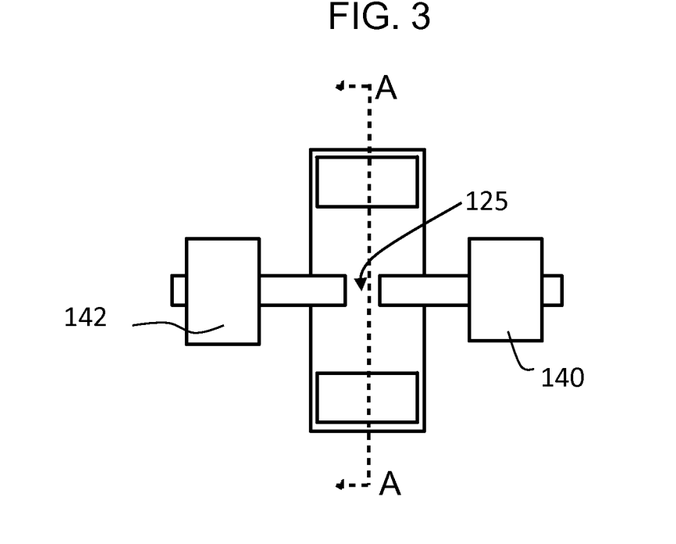
FIG. 3 is a top plan view of an antifuse according to an embodiment of the invention, showing the antifuse in a programmed state.
Figure 4:
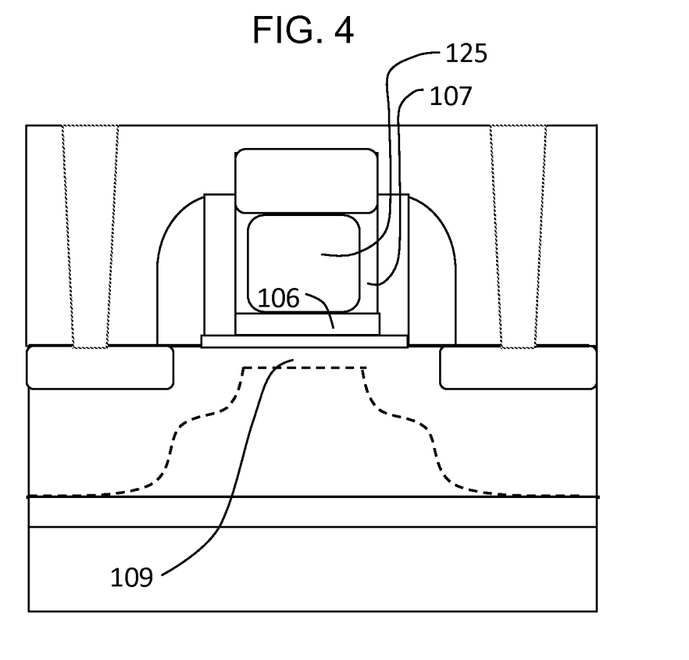
FIG. 4 is a corresponding sectional view of the antifuse of FIG. 3 through line A-A thereof, showing the antifuse in the programmed state.

Referring to FIGS. 3 and 4, to program the antifuse 100, circuitry (not shown) applies a programming voltage between the cathode 140 and the anode 142 which then causes a programming current to flow through the gate 105 therebetween. The programming current heats the metal gate 105 of the antifuse sufficiently to cause electromigration therein between the cathode and the anode. The electromigration produces one or more voids within the metal gate which grows as the metal migrates away from an initial site. In time, a gap 125 appears in the gate between the cathode 140 and anode 142. In one example, the gap may be a complete discontinuity in the metal gate between the cathode 140 and the anode 142. In another example, the gap 125 may not be a complete discontinuity but may nevertheless leave so little conductive material remaining at one or more particular locations of the metal gate that the gate is no longer capable of turning off the conduction channel 109 of the antifuse under gate biasing conditions used to determine the state of the antifuse.

With continued reference to FIGS. 3 and 4, the primary gate metal region 107 of the antifuse may develop a void before another portion of the gate, i.e., metal region 106, due to its much lower melting point than that of a metal region which includes a material such as titanium nitride, tantalum nitride or other similar material. During programming, the higher resistivity of the metal region 106 compared to the primary gate metal region 107 may concentrate heating to the area within the primary gate metal region 107 and the newly formed void therein. Then, the heating will begin to cause electromigration of the material of the metal region 106. Programming of the antifuse typically endpoints when the above-described gap forms between the cathode and the anode, such gap usually halting current flow between the cathode and the anode. A gap 125 having sufficient size to function reliably to indicate the antifuse's programmed state can be achieved through appropriate selection of the amount of programming current conducted between the cathode and anode, and the speed at which the programming is performed. In one example, the electrical resistance of the metal gate 105 can be between 10 and 70 ohms under gate biasing conditions in which the normally on conduction channel will be turned off. After programming, the electrical resistance of the gate can be greater than 10,000 ohms under any gate bias conditions, i.e., whether or not the gate bias voltage is greater than $V_T$. In this case, the gate no longer is capable of turning off the conduction channel.

In one example, the antifuse can be programmed using a relative low voltage that is close to the voltages used for operating MOSFETs on the same semiconductor chip which have similar device structures, except that other MOSFETS need not have a cathode and an anode connected to their gates. Thus, while a power supply voltage Vdd used to operate a similar MOSFET on the same chip may be about 0.9 to 1.6 volts, in one example, the voltage applied between the cathode and the anode may be the same. In another example, the voltage may be only a little higher than the standard Vdd operating voltage, for example, a voltage having a level between 0.9 and 2.5 volts. Thus, in one example, a programming voltage can be applied between the cathode and the anode which is approximately equal to the nominal maximum power supply voltage Vdd that can be applied to one or more of the source, drain or the gate of a MOSFET on the same chip to operate such MOSFET.

Figure 5:
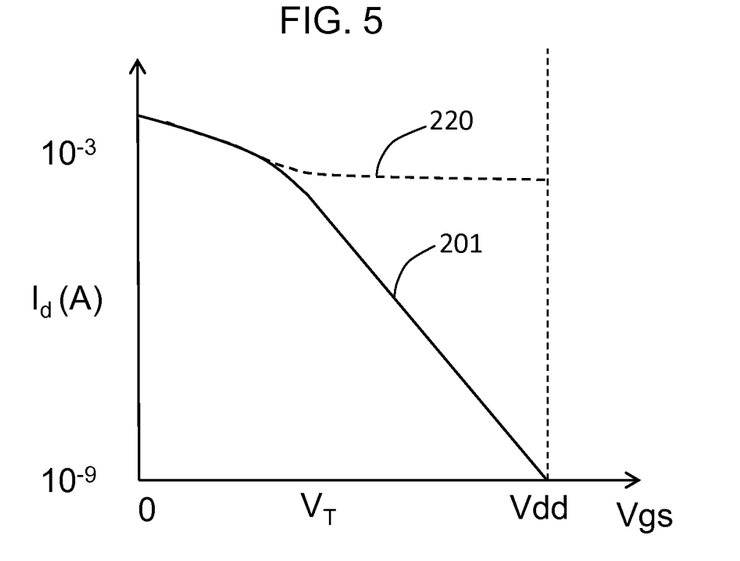
FIG. 5 is a graph showing a current versus voltage characteristic of the antifuse of FIGS. 1-4 for both unprogrammed and programmed states.

FIG. 5 illustrates a current-voltage characteristic of the antifuse in both the initial unprogrammed state and the final programmed state. Initially, in an unprogrammed state as seen at curve 201 in FIG. 5, the current-voltage characteristic resembles that of an ordinary PFET in which when the gate to source voltage or "Vgs" is below a voltage $V_T$ for turning off the MOSFET, the antifuse is turned on and the current ($I_d$) between the source and drain regions may be approximately $10^{-3}$ amperes, for example. However, when the voltage Vgs is well above $V_T$, the current ($I_d$) between the source and drain regions becomes very low, and may be at nanoampere ($10^{-9}$ ampere) levels, for example, when Vgs is at Vdd, e.g., being between about 0.9 and 1. 6 volts.

Conversely, as seen at curve 220 in FIG. 5, once the antifuse has been programmed, the amount of current ($I_d$) conducted between the source and drain regions 110, 112 of the antifuse when voltage Vgs exceeds $V_T$ can greatly exceed that of the initially unprogrammed antifuse. For example, this would be the case when Vgs is raised to a power supply voltage Vdd of 0.9 to 1.6 V, In the example shown at 220 in FIG. 5, after programming, for a voltage Vgs greater than $V_T$ the antifuse conducts a relatively constant amount of current ($I_d$), even at levels well above the initial threshold voltage $V_T$. As depicted in FIG. 5, for example, when Vgs is equal to Vdd, the amount of current ($I_d$) 201 conducted by the antifuse before programming may be around $10^{-9}$ ampere. After programming, the amount of current ($I_d$) 220 conducted by the antifuse when Vgs is equal to Vdd can be approximately $10^{-3}$ ampere, a difference of about six orders of magnitude.

Figure 6:
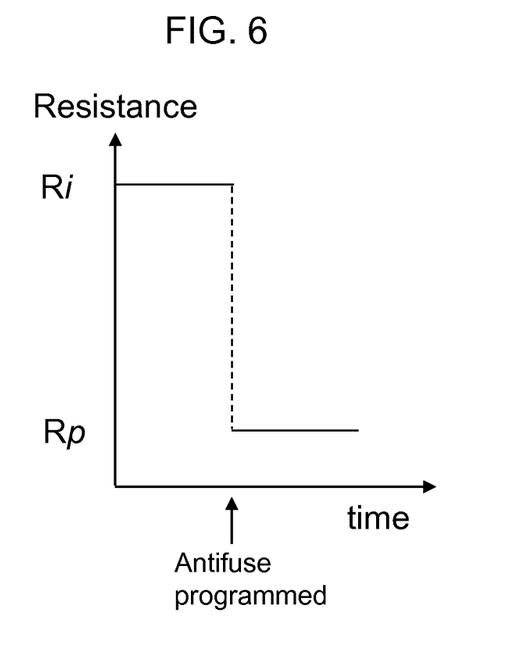
FIG. 6 is a graph illustrating an initial resistance Ri and a final programmed resistance Rp between the source and the drain of the antifuse of FIGS. 1-4.

FIG. 6 further illustrates the electrical resistance of the antifuse between the source and drain regions for a gate bias condition in which Vgs>$V_T$, for example. FIG. 6 depicts change in the electrical resistance of the antifuse at such gate bias condition between an initial resistance value Ri before programming and the subsequent resistance value Rp achieved by programming the antifuse. From the above description regarding the amount of current conducted by the antifuse, it follows that the electrical resistance between the source and drain regions of the antifuse after programming decreases by several orders of magnitude from the before programming value for Vgs being greater than $V_T$. The change in the resistance of the antifuse and the current state of the antifuse can be detected, for example, by circuitry which applies the same biasing conditions to the source region, the drain region and gate of the antifuse device under test that are applied to a representative sample device, and outputs a result based on which device has the greater resistance. Thus, when the circuit detects the antifuse as more resistive than the sample device the circuit outputs a result indicating the antifuse is "not programmed" or "unprogrammed". Conversely, when the circuit detects the antifuse as being less resistive than the sample device the circuit outputs a result indicating the antifuse is "programmed". Such comparison technique is robust, because conditions such as variations in power, voltage or temperature which can affect the resistance of the device under test tend also to affect the resistance of the representative sample device in the same way. The particular pre- and post-programming resistance values of the antifuse are not limited to any particular values or ranges of values except that programming the antifuse decreases the resistance by one or more orders of magnitude. However, in a particular example, the electrical resistance between the source and drain regions of the antifuse when Vgs equals a voltage of Vdd (e.g., a voltage sufficient to fully turn off the antifuse when the antifuse has not yet been programmed) can be greater than 100,000 ohms when the antifuse has not been programmed, and can fall to less than 10,000 ohms when the antifuse has been programmed.

A resistance comparison technique yields a strong binary signal when, for a biasing condition of Vgs>VT and a voltage of Vdd being applied between the source and drain regions, the pre-programming resistance value of the antifuse is consistently greater than the sample device resistance. In this case, the biasing conditions are a voltage at the drain Vd=zero (ground), the voltage at the source Vs=Vdd, and the voltage at the gate Vg>Vdd+$V_T$. Moreover, using such technique, the post-programming resistance value of the antifuse is consistently lower than the sample device resistance. The antifuse device embodiments herein help achieve this goal because the only result required by programming the antifuse is to form a gap or a void in the metal gate that prevents the gate from being able to subsequently turn off the conduction channel under the metal gap or void.

Figure 7:
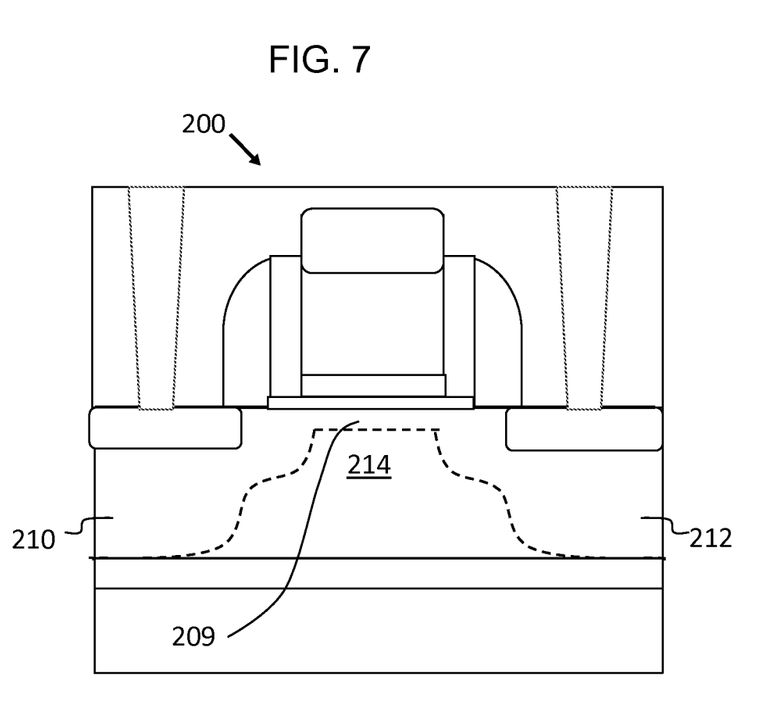
FIG. 7 is a sectional view illustrating an n-type channel type antifuse according to a variation of the embodiment illustrated in FIGS. 1-4.

Referring to FIG. 7, in a variation of the above-described PFET-like structure, an antifuse 200 according to another embodiment herein can instead resemble an NFET when the source region 210 and the drain region 212 each has n-type conductivity. N-type conductivity can be achieved by doping these regions with an n-type dopant, which in one example can be arsenic or phosphorus. In such case, the body 214 includes a "p-well" having p-type conductivity, and the conduction channel 209 can be formed using one or more threshold voltage adjustment implants. In one example, the conduction channel 209 in this case can be formed via threshold voltage adjustment implants performed with the same conditions and at the same time as threshold voltage adjustment implants performed for PFET transistors being processed simultaneously on the same chip and same wafer. In another example, one or more implants can be performed specific to the antifuse 200 under conditions specific thereto. In this case, the source and drain regions 210, 212 can be heavily doped as n+doped regions and then the dopant concentration of the p-type doped body 214 is less heavily doped than the n+ doped source and drain regions.

Figure 8:
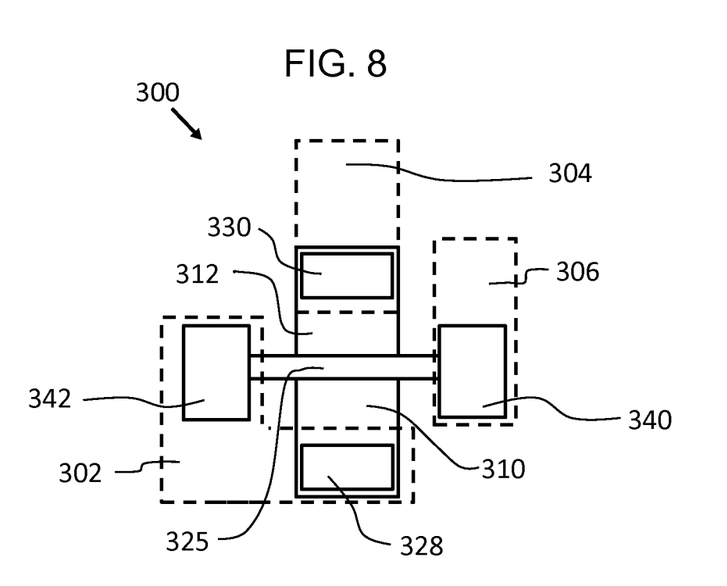
FIG. 8 is a top plan view illustrating an example of an interconnection arrangement of an antifuse according to one or more of the embodiments herein.

FIG. 8 illustrates further electrical interconnection of an antifuse 300 according to one or more of the above-described embodiments of the invention. As illustrated therein, a first metal wiring element 302 can be electrically connected with the anode 342 and the conductive via 328 which contacts the source 310 of the antifuse. A second metal wiring element 304 can be electrically connected with the conductive via 330 that contacts the drain 312 of the antifuse. A third metal wiring element 306 can be electrically connected with the cathode 340. In one example, the antifuse 300 has a structure similar to a depletion mode PFET as described above. To program the antifuse, the anode can be set to a voltage such as a power supply voltage of 0.9-1.6 volts by setting the voltage at the first metal wiring element 302 to that level and the voltage on the cathode is then set to ground by connecting the third wiring element 306 to ground, and the drain region of the antifuse can be set to ground or allowed to float at that time. Alternatively, the antifuse can be programmed with opposite current flow through the metal gate 325. In other words, the cathode can be set to a voltage such as a power supply voltage of 0.9 to 1.6 volts by setting the voltage at the third wiring element 306 to that level. When programming the antifuse, the voltage on the anode, and the source and drain regions can be set to a voltage such as ground by setting the voltage at the first and second wiring elements 302 and 304 to ground. In this way, during programming a current will flow along the gate 325 of the antifuse between the cathode and the anode. After supplying the programming voltages, the voltages on the source and drain regions, the cathode and the anode can be returned to ground until another time at which the state of the antifuse can be read.

To determine the state of the antifuse at any time the cathode and the anode can be set to a level such as Vdd by setting the voltages on the first and third metal wiring elements to Vdd. The voltage on the second metal wiring element 304 can be set to ground at such time. When the antifuse has not yet been programmed, under such biasing voltages, the conduction channel will be turned off such that current does not flow, or only an inconsequential amount of current flows between the source 310 and the drain 312. However, when the antifuse has already been programmed, under such biasing voltages, the conduction channel will not be turned off such that substantial current flows between the source 310 and the drain 312.

Figure 9:
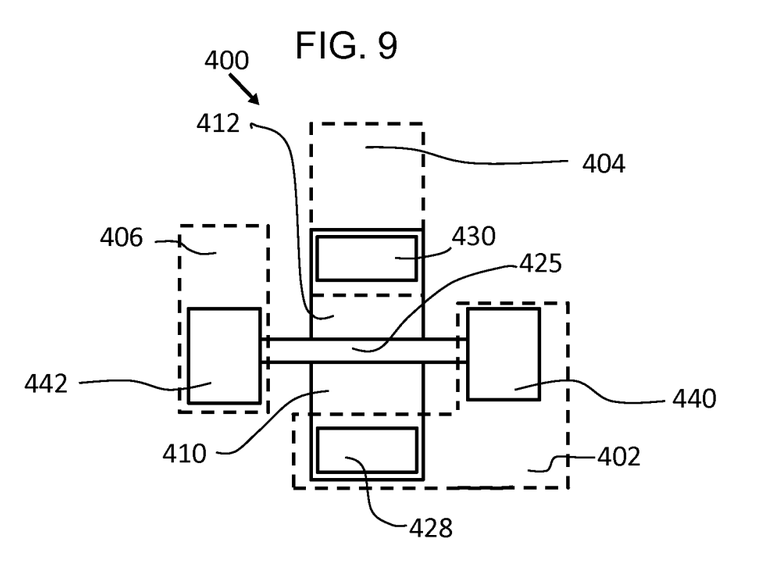
FIG. 9 is a top plan view illustrating another example of an interconnection arrangement of an antifuse according to one or more of the embodiments herein.

FIG. 9 illustrates an alternative arrangement which can be used to program the antifuse and determine the state of the antifuse 400. In this case, a first metal wiring element 402 can be electrically connected with the cathode 440 and the conductive via 428 which contacts the source 410 of the antifuse. A second metal wiring element 404 can be electrically connected with the conductive via 430 that contacts the drain 412 of the antifuse. A third metal wiring element 406 can be electrically connected with the anode 442. In one example, the antifuse 400 has a structure similar to a depletion mode PFET as described above. To program the antifuse according to such example, the cathode can be set to a voltage such as a power supply voltage of 0.9 to 1.6 volts by setting the voltage at the first metal wiring element 402 to that level. When programming the antifuse, the voltage on the anode can be set to a voltage such as Vdd, e.g., 0.9-1.6 volts, by setting the voltage on the third metal wiring element 406 to Vdd. The voltage on the cathode 440 can then be set to ground by connecting the first metal wiring element 402 to ground. The voltage on the drain region of the antifuse can either be set to ground or allowed to float at that time. Alternatively as in the arrangement in FIG. 9, the voltages on the cathode and the source can be set to a voltage such as Vdd, e.g., 0.9 to 1.6 volts, by setting the voltage on the first wiring element 402 to Vdd. The voltage on the second metal wiring element can be either set to Vdd or allowed to float and the voltage on the third metal wiring element can be set to ground at such time to set corresponding voltages on the drain 412 and the anode 442, respectively. In such way, during programming a current will flow along the gate 425 of the antifuse between the cathode and the anode. After supplying the programming voltages, the voltages on the source and drain regions and the anode can be returned to ground or other voltage.

To determine the state of the antifuse at any time the cathode and the anode can be set to a level such as Vdd by setting the voltages on the first and third metal wiring elements to Vdd. The voltage on the second metal wiring element 404 can be set to ground at such time. When the antifuse has not yet been programmed, under such biasing voltages, the conduction channel will be turned off such that current does not flow, or only an inconsequential amount of current, e.g., $10^{-9}$ amperes, flows between the source 410 and the drain 412. However, when the antifuse has already been programmed, under such biasing voltages, the conduction channel will not be turned off such that substantial current, e.g., $10^{-4}$ to $10^{-3}$ amperes, flows between the source 410 and the drain 412.

When the antifuse has a structure similar to an NFET as described above relative to FIG. 7, programming of the antifuse can be carried out by one or more of the techniques described above relative to FIG. 8 or 9. However, in this case, the state of the antifuse can be detected by setting a voltage on the cathode and the anode of the antifuse and on one of the source region or the drain region of the antifuse to a voltage that is below ground, i.e., Vgs<zero volts, so as to be below a threshold voltage for turning off the conduction channel of the unprogrammed antifuse. When the antifuse has not yet been programmed, under such biasing voltages, the conduction channel will be turned off such that current does not flow, or only an inconsequential amount of current, e.g., $10^{-9}$ amperes, flows between the source 210 and the drain 212. However, when the antifuse has already been programmed, under such biasing voltages, the conduction channel will not be turned off such that substantial current, e.g., $10^{-4}$ to $10^{-3}$ amperes, flows between the source 210 and the drain 212.

The above-described embodiments provide an antifuse which can be fabricated simultaneously with other MOSFETs, e.g., CMOS transistors, on a wafer and a chip thereof without requiring additional process steps or mask levels to produce the antifuse. As indicated above, it may be possible to program the antifuse without requiring a higher than usual voltage level, i.e., such as by using the same power supply voltage level Vdd as used in other operations by other devices, e.g., CMOS field effect transistors of the same chip. Thus, the gate may be configured to conduct the programming current when a programming voltage of less than one volt is applied between the cathode and the anode which is the same as a power supply voltage that can be used to operate field effect transistors on a semiconductor chip which embodies the antifuse.

Increased programming yield is expected with embodiments as described herein by the simple fact that a gap produced in the metal gate of a depletion mode MOSFET by programming will render the antifuse into a programmed state that is now permanently on for all gate bias voltages. Moreover, the antifuse embodiments described herein may have a greater tolerance for imperfect programming and lifetime reliability in the field than the antifuses described in the background, and may be less sensitive to variations in the manufacturing or programming process than the antifuses described in the background.

While the invention has been described in accordance with certain preferred embodiments thereof, those skilled in the art will understand the many modifications and enhancements which can be made thereto without departing from the true scope and spirit of the invention, which is limited only by the claims appended below.

What is claimed is:

1. A method of programming an antifuse, comprising:
 driving a programming current between a cathode and an anode of the antifuse, so as to drive the programming current through a gate of a depletion mode metal oxide semiconductor field effect transistor ("MOSFET"), the gate having at least one metal layer, in which the cathode and the anode are each electrically coupled to the gate and spaced apart from one another in a direction the gate extends, so as to create a gap in the metal layer.

2. The method as claimed in claim 1, further comprising detecting whether the antifuse has been programmed by applying a voltage greater than a threshold voltage between the gate and a source region of the MOSFET and detecting whether the conduction channel turns off with such applied voltage.

3. The method as claimed in claim 1, wherein the driving of the programming current generates a gap in the gate such that the conduction channel no longer turns off when the voltage greater than the threshold voltage is applied to the gate.

4. The method as claimed in claim 1, wherein the MOSFET has a conduction channel, a source region, and a drain region separated from the source region by the conduction channel, wherein a resistance between a source region and the drain region has a first value when the antifuse is unprogrammed and the voltage greater than the threshold voltage is applied to the gate, and the resistance between the source region and the drain region has a second value when the antifuse has been programmed and the voltage greater than the threshold voltage is applied to the gate, the second value being one or more orders of magnitude lower than the first value.

5. The method as claimed in claim 1, wherein the MOSFET includes a source region and a drain region separated from the source region by a conduction channel, the method further comprising detecting an electrical resistance between the source region and the drain region when a voltage greater than a threshold voltage for turning off the conduction channel is applied to the gate, and using the detected resistance to determine whether or not the antifuse has been programmed.

6. The method as claimed in claim 1, wherein the step of driving the programming current is performed by applying a programming voltage which is the same as a power supply voltage used to operate field effect transistors on a semiconductor chip which embodies the antifuse.

7. The method as claimed in claim 1, wherein the depletion mode MOSFET is a p-type channel depletion mode MOSFET, the method further comprising detecting whether the antifuse has been programmed while applying a voltage that is greater than ground to the gate.

8. The method as claimed in claim 1, wherein the depletion mode MOSFET is an n-type channel depletion mode MOSFET, the method further comprising detecting whether the antifuse has been programmed while applying a voltage that is greater than gate to the ground.

9. A method of programming an antifuse comprising:
 driving a programming current between a cathode and an anode of the antifuse and through a gate of a depletion mode MOSFET, the gate overlying a conduction channel and having at least one metal layer, in which the cathode and the anode are each electrically coupled to the gate and spaced apart from one another in a direction the gate extends, so as to create a gap in the metal layer, wherein under appropriate biasing conditions, the gate is configured such that when the antifuse is unprogrammed, the conduction channel is turned on unless a voltage above a first threshold voltage is applied to the gate to turn off the conduction channel, and the gate being configured such that when the antifuse has been programmed, the conduction channel remains turned on even if a voltage above the first threshold voltage is applied between the gate and a source region of the MOSFET.

10. The method as claimed in claim 9, further comprising detecting whether the antifuse has been programmed by applying a voltage greater than a threshold voltage between the gate and a source region of the MOSFET and detecting whether the conduction channel turns off with such applied voltage.

11. The method as claimed in claim 9, wherein the driving of the programming current generates a gap in the gate such that the conduction channel no longer turns off when the voltage greater than the threshold voltage is applied to the gate.

12. The method as claimed in claim 9, wherein the MOSFET has a conduction channel, a source region, and a drain region separated from the source region by the conduction channel, wherein a resistance between a source region and the drain region has a first value when the antifuse is unprogrammed and the voltage greater than the threshold voltage is applied to the gate, and the resistance between the source region and the drain region has a second value when the antifuse has been programmed and the voltage greater than the threshold voltage is applied to the gate, the second value being one or more orders of magnitude lower than the first value.

13. The method as claimed in claim 9, wherein the MOSFET includes a source region and a drain region separated from the source region by a conduction channel, the method further comprising detecting an electrical resistance between the source region and the drain region when a voltage greater than a threshold voltage for turning off the conduction channel is applied to the gate, and using the detected resistance to determine whether or not the antifuse has been programmed.

14. The method as claimed in claim 9, wherein the step of driving the programming current is performed by applying a programming voltage which is the same as a power supply voltage used to operate field effect transistors on a semiconductor chip which embodies the antifuse.

15. A method of programming an antifuse comprising:

driving a programming current between a cathode and an anode of the antifuse and through a gate of a depletion mode MOSFET, the gate overlying a conduction channel and having at least one metal layer, in which the cathode and the anode are each electrically coupled to the gate and spaced apart from one another in a direction the gate extends, so as to create a gap in the metal layer, wherein under appropriate biasing conditions, the gate is configured such that when the antifuse is unprogrammed, the conduction channel is turned on unless a voltage above a first threshold voltage is applied to the gate to turn off the conduction channel, and the gate being configured such that when the antifuse has been programmed, the conduction channel remains turned on even if a voltage above the first threshold voltage is applied between the gate and a source region of the MOSFET, and wherein the gate is configured to conduct the programming current when a programming voltage of less than one volt is applied between the cathode and the anode which is the same as a power supply voltage that can be used to operate field effect transistors on a semiconductor chip which embodies the antifuse.

16. The method as claimed in claim 15, further comprising detecting whether the antifuse has been programmed by applying a voltage greater than a threshold voltage between the gate and a source region of the MOSFET and detecting whether the conduction channel turns off with such applied voltage.

17. The method as claimed in claim 15, wherein the driving of the programming current generates a gap in the gate such that the conduction channel no longer turns off when the voltage greater than the threshold voltage is applied to the gate.

18. The method as claimed in claim 15, wherein the MOSFET has a conduction channel, a source region, and a drain region separated from the source region by the conduction channel, wherein a resistance between a source region and the drain region has a first value when the antifuse is unprogrammed and the voltage greater than the threshold voltage is applied to the gate, and the resistance between the source region and the drain region has a second value when the antifuse has been programmed and the voltage greater than the threshold voltage is applied to the gate, the second value being one or more orders of magnitude lower than the first value.

19. The method as claimed in claim 15, wherein the MOSFET includes a source region and a drain region separated from the source region by a conduction channel, the method further comprising detecting an electrical resistance between the source region and the drain region when a voltage greater than a threshold voltage for turning off the conduction channel is applied to the gate, and using the detected resistance to determine whether or not the antifuse has been programmed.

20. The method as claimed in claim 15, wherein the step of driving the programming current is performed by applying a programming voltage which is the same as a power supply voltage used to operate field effect transistors on a semiconductor chip which embodies the antifuse.

* * * * *